(12) United States Patent
Glöss

(10) Patent No.: US 10,461,612 B2
(45) Date of Patent: Oct. 29, 2019

(54) PLANAR POSITIONING APPARATUS AND POSITIONING TABLE

(71) Applicant: PHYSIK INSTRUMENTE (PI) GMBH & CO. KG, Karlsruhe (DE)

(72) Inventor: Rainer Glöss, Karlsruhe (DE)

(73) Assignee: PHYSIK INSTRUMENTE (PI) GMBH & CO. KG, Karlsruhe (DE)

( * ) Notice: Subject to any disclaimer, the term of this patent is extended or adjusted under 35 U.S.C. 154(b) by 57 days.

(21) Appl. No.: 15/775,123

(22) PCT Filed: Oct. 31, 2016

(86) PCT No.: PCT/EP2016/076193
§ 371 (c)(1),
(2) Date: May 10, 2018

(87) PCT Pub. No.: WO2017/080859
PCT Pub. Date: May 18, 2017

(65) Prior Publication Data
US 2018/0269756 A1    Sep. 20, 2018

(30) Foreign Application Priority Data
Nov. 13, 2015  (DE) .................. 10 2015 222 482

(51) Int. Cl.
*H02K 21/12* (2006.01)
*H02K 15/03* (2006.01)
*H02K 7/14* (2006.01)

(52) U.S. Cl.
CPC .............. *H02K 15/03* (2013.01); *H02K 7/14* (2013.01)

(58) Field of Classification Search
CPC ...... H02K 29/12; H02K 2211/03; H02K 3/26; H02K 11/20; H02K 11/24
(Continued)

(56) References Cited

U.S. PATENT DOCUMENTS

| | | | |
|---|---|---|---|
| 4,658,162 A * | 4/1987 | Koyama | H01F 5/003 310/184 |
| 6,452,292 B1 | 9/2002 | Binnard | 310/12.06 |

(Continued)

FOREIGN PATENT DOCUMENTS

| | | | |
|---|---|---|---|
| DE | 102011100153 A1 | 10/2012 | H02K 41/03 |
| WO | WO0010242 A1 | 2/2000 | B60L 13/10 |

(Continued)

OTHER PUBLICATIONS

Notification Concerning Transmittal of International Preliminary Report on Patentability (Chapter I of the Patent Cooperation Treaty), in English, dated May 24, 2018, which was issued by the International Bureau of WIPO in Applicant's corresponding international PCT application having Serial No. PCT/EP2016/076193, filed on Oct. 31, 2016.

(Continued)

*Primary Examiner* — Thanh Lam
(74) *Attorney, Agent, or Firm* — Bodner & O'Rourke, LLP; Gerald T. Bodner; Christian P. Bodner

(57) ABSTRACT

The invention relates to a planar positioning apparatus, comprising a stator, which comprises a coil arrangement comprising flat coils, a rotor which is arranged opposite the stator in the operating position of the positioning apparatus and has a planar magnet arrangement comprising a plurality of rows of magnets, wherein the plane which is spanned by the planar magnet arrangement is arranged parallel to the plane of the coil arrangement, a position detecting device for detecting the position of the rotor relative to the stator, and an evaluation and control device for evaluating position signals of the position detecting device and for controlling a current supply to the coil arrangement for controlling the position of the rotor with respect to the stator, wherein the coil arrangement comprises in each case n×3 (n≥1) elongate flat coils which are interleaved with one another, in a first (Continued)

Figure 1:
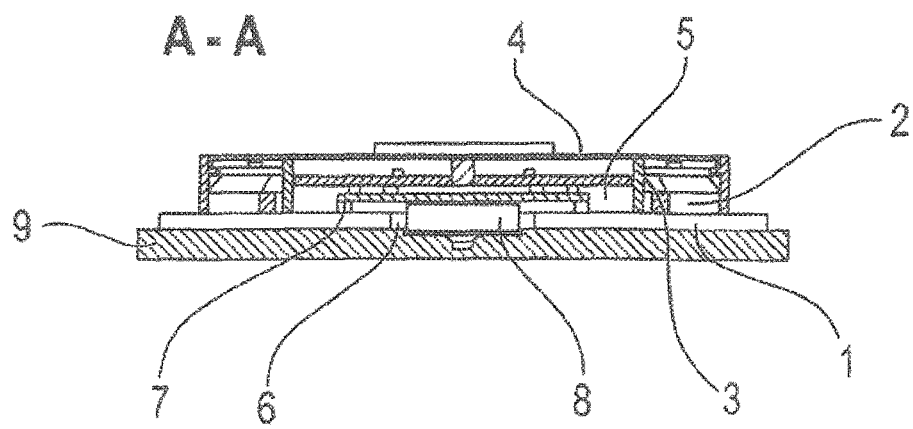

and second orientation of the coil arrangement which, over the majority of their extent, are designed as conductor runs of a first plane of a multiple-plane printed circuit board, and the conductor runs of the three associated flat coils enclose crossover regions which run in a second plane of the multiple-plane printed circuit board.

15 Claims, 3 Drawing Sheets

(58) Field of Classification Search
USPC .................. 310/156.01, 71, 68 B, 208, 12.19
See application file for complete search history.

(56) References Cited

U.S. PATENT DOCUMENTS

| | | | | |
|---|---|---|---|---|
| 6,605,939 | B1* | 8/2003 | Jansseune | G01D 5/2033 324/207.16 |
| 7,573,173 | B1* | 8/2009 | Frownfelter | H02K 3/47 310/208 |
| 8,704,513 | B2* | 4/2014 | Lepage | G01N 27/9033 324/239 |
| 8,912,696 | B2* | 12/2014 | Kawakubo | H02K 11/33 310/85 |
| 9,479,040 | B2 | 10/2016 | Schaffel et al. | |
| 2006/0049699 | A1 | 3/2006 | Wang et al. | 310/12.18 |
| 2007/0035267 | A1 | 2/2007 | Gao et al. | 318/649 |
| 2013/0257575 | A1 | 10/2013 | Timashov et al. | 336/200 |
| 2015/0340931 | A1* | 11/2015 | Zhang | H02K 41/031 310/68 R |
| 2016/0377455 | A1* | 12/2016 | Matsumoto | G01F 1/582 324/207.15 |

FOREIGN PATENT DOCUMENTS

| | | | |
|---|---|---|---|
| WO | WO2009115071 A2 | 9/2009 | ............ H02K 21/26 |
| WO | WO2013059934 A1 | 5/2013 | ............ H01L 21/67 |

OTHER PUBLICATIONS

English translation of the International Preliminary Report on Patentability (Chapter I of the Patent Cooperation Treaty), dated May 15, 2018, which was issued by the International Bureau of WIPO in Applicant's corresponding international PCT application having Serial No. PCT/EP2016/076193, filed on Oct. 31, 2016.
Written Opinion of the International Searching Authority, in English, dated Feb. 17, 2017, which was issued by the International Bureau of WIPO in Applicant's corresponding international PCT application having Serial No. PCT/EP2016/076193, filed on Oct. 31, 2016.
International Search Report, in English, dated Feb. 17, 2017, which was issued by the International Bureau of WIPO in Applicant's corresponding international PCT application having Serial No. PCT/EP2016/076193, filed on Oct. 31, 2016.

* cited by examiner

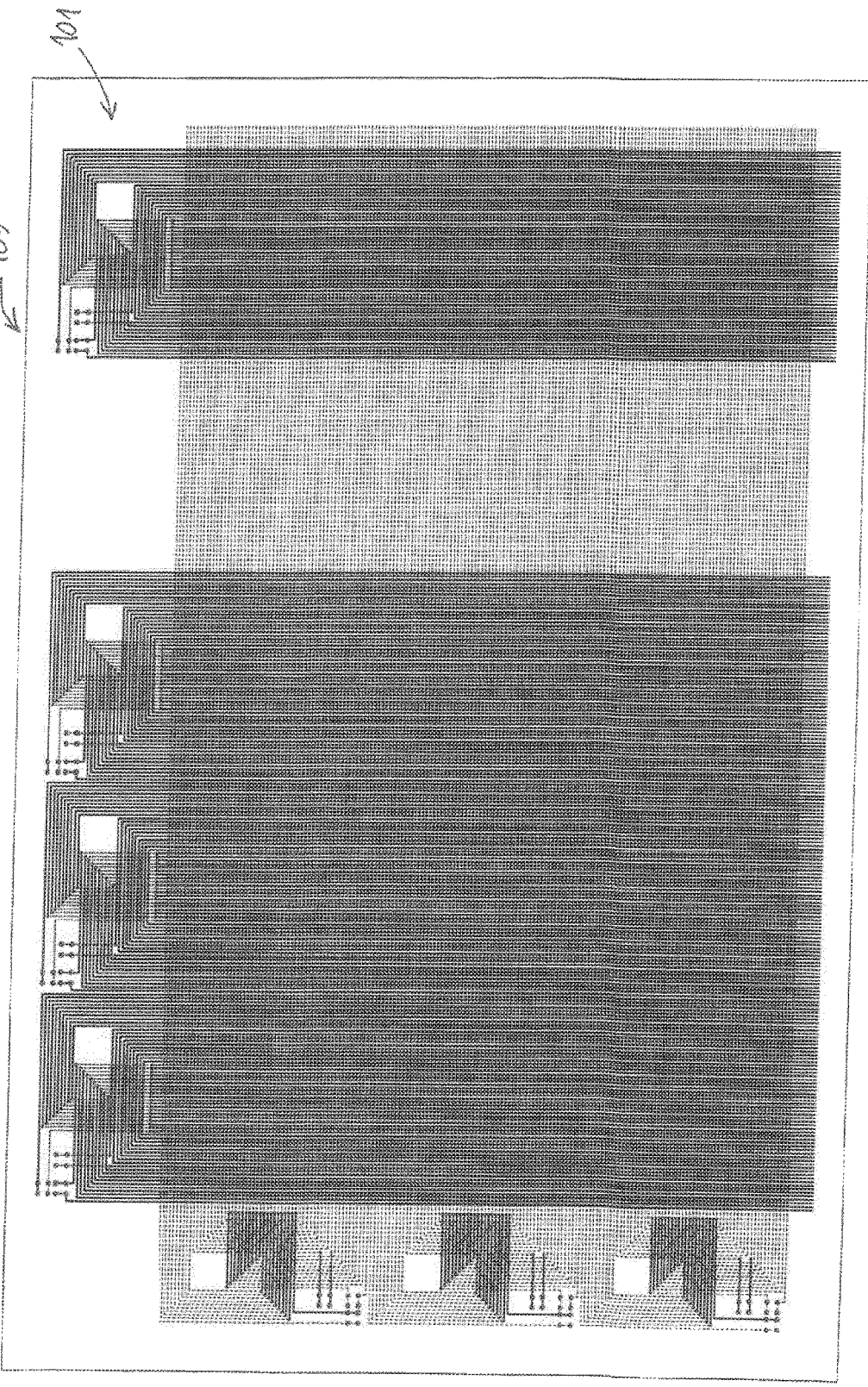

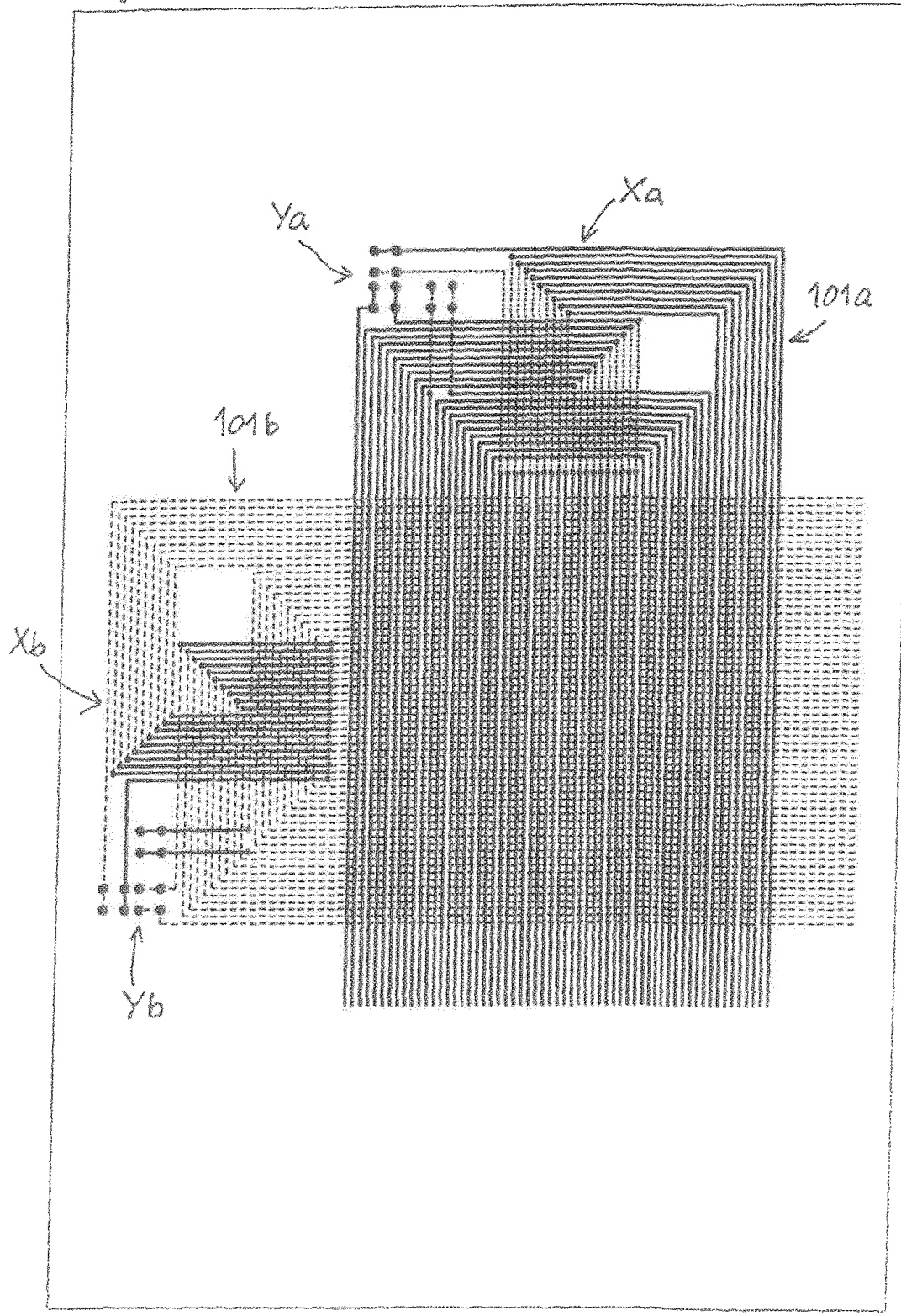

PLANAR POSITIONING APPARATUS AND POSITIONING TABLE

The invention relates to a planar positioning apparatus, comprising a stator, which comprises a coil arrangement of flat coils, a rotor which is arranged opposite the stator in the operating position of the positioning apparatus and has a planar magnet arrangement comprising a plurality of rows of magnets, wherein the plane which is spanned by the planar magnet arrangement is arranged parallel to the plane of the coil arrangement, a position detecting device for detecting the position of the rotor relative to the stator, and an evaluation and control device for evaluating position signals of the position detecting device and for controlling a current supply to the coil arrangement for controlling the position of the rotor with respect to the stator.

Numerous types of machine tools or other machining or measurement arrangements are equipped with positioning tables, also referred to as cross table or XY table, for adequately positioning a workpiece with respect to a tool or else a measurement object with respect to a measuring device. Advanced positioning tables of this kind do not only offer a pure XY positioning but also multi-axis positioning and are also referred to in their highest stage of development as 6D positioners or tables.

While traditional XY or cross tables are equipped with two linear actuators, drive concepts gain practical importance for some time which are based on flat coil arrangements or planar arrays of permanent magnets on the stator and/or rotor side. So-called "planar motors" or planar drives only comprise a single motor primary part (stator) and a motor secondary part (rotor) equipped with permanent magnets so that a second drive motor is omitted just as are additional mechanical transmission elements which are required, for instance, in ball screw drives.

Planar positioning apparatuses of the mentioned or similar kind are known from U.S. Pat. No. 6,452,292 B1, US 2007/0035267 A1, US 2006/0049699 A1 and WO 2009/115071 A2, for example.

Figure 2:
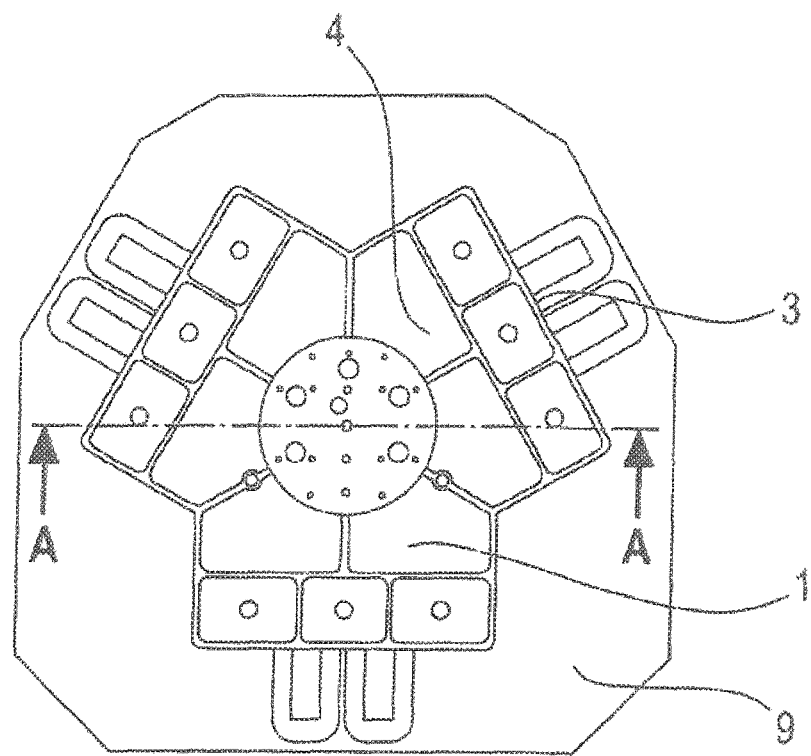

Also, document DE 10 2011 100 153 A1 originating from the Applicant, discloses a generic planar positioning apparatus. The structure of this planar positioning apparatus is schematically shown in FIGS. 1 and 2.

A planar coil array 1 made of six flat coils here, which are arranged in three pairs in a star shape each offset by 120°, is arranged on and attached to a stator plate 9. In the center of the coil array, a free space or window 6 is left, in which a position measuring head (6D measuring head) 8 is mounted to the stator plate. Above the stator plate 9 comprising the coil array 1, a rotor 3 is arranged, that is movable relative to same and comprises a planar magnet array 2 formed of three rows of mutually polarized magnets each positioned to be centric to a coil pair of the coil array 1 when the rotor 3 is in the central position. In the center of the magnet array as well, a free space or window 5 is situated offering space for an area scale 7 which, in cooperation with the position measuring head 8, serves to measure the position of the rotor 3 relative to the stator 9. On the upper side of the rotor 2, an object carrier or workpiece carrier 4 is arranged.

WO 2013/0059934 A1 likewise describes a planar positioning apparatus of the kind described above, in which the coil arrangement is realized of conductor tracks extending in several planes of the stator and comprising a plurality of flat coils in a first orientation and a second orientation of the conductor tracks or coil windings perpendicular thereto. As far as can be seen, the coil arrangement extends over four or more conductor planes of the stator. How the connections for the current supply of the plurality of coils are realized cannot be derived in detail from the publication.

The invention is based on the task to propose a planar positioning apparatus having a simplified structure, in particular of the stator, and with a facilitated manufacturing process and thus lower production costs.

The task is solved by a planar positioning device having the features of claim 1. Appropriate further developments of the inventive idea are the subject matter of the dependent claims. Moreover, an advantageous positioning table is proposed.

The invention includes the idea to reduce, in order to simplify the stator structure and thus reduce costs associated therewith, the number of conductor planes for realizing the coil arrangement. Preferably, a traditional circuit board having two conductor planes and an intermediate insulating layer should serve this purpose according to a further fundamental consideration of the inventors.

The invention further includes the idea to achieve this by interleaving the associated flat coils of the three phases having the same orientation (i.e. the same extension direction of the substantial longitudinal extent of the conductor tracks). Finally, the invention includes the idea of a particular geometric configuration of the unavoidable crossover regions of conductor tracks of the interleaved flat coils enabling to do without an additional (specifically third) conductor plane.

According to the invention, it is thus envisaged altogether for the coil arrangement to comprise in each case n×3 (n≥1) elongate flat coils which are interleaved with one another, in a first and second orientation of the coil arrangement, which over the majority of their extent, are designed as conductors tracks of a first plane of a multiple-plane printed circuit board, and the conductor tracks of the three associated flat coils enclose crossover regions which run in a second plane of the multiple-plane printed circuit board. Specifically, the n×3 flat coils of the first orientation run over the majority of their extent in the first plane and the associated crossover regions in the second plane of the multiple-plane printed circuit board, while the n×3 flat coils of the second orientation run over the majority of their extent in the second plane and the associated crossover regions in the first plane of the multiple-plane printed circuit board.

This structure enables the stator or the part of a planar positioning apparatus of the generic kind that carries the coil arrangement, to be constructed in the simplest case from a single traditional two-plane printed circuit board, however, in any case from printed circuit boards having a reduced number of conductor planes. Apart from material cost for the basic multiple-plane printed circuit board, this saves constructional height and enables a more compact structure of the positioning apparatus. The solution also saves workload in producing the coil arrangement, in particular in realizing the connections thereof. Altogether, the result is a significant simplification of the manufacturing process and reduction of the production costs.

In this case, a part of the connection ends of all flat coils is respectively situated in particular in the first plane of the multiple-plane printed circuit board, and another part in the second plane thereof. Moreover, all of the connection ends of the three associated flat coils of the three phases each are concentrated in an advantageous manner in a small connection region of the multiple-plane printed circuit board. This facilitates the connection ends to be equipped with respective connection contacts and thus the structure and handling of the stator of the positioning apparatus as a whole.

For the purpose of simply balancing and operating the coil arrangement, all of the flat coils are preferably realized to have substantially the same length and the same ohmic resistance. Simplification in design, manufacturing steps and quality testing is achieved by a design in which all of the flat coils are designed with a largely rectangular extent of the conductors.

In a further embodiment, in which the coil arrangement covers substantially the entire surface of the stator, a basically wider travel range is realized. This travel range may be specifically optimized in an embodiment, in which the position detecting device comprises a position measuring head arranged within the stator or the rotor in the operating position of the positioning device, and an area scale fixed true to position to the rotor or the stator, and in which the stator or the rotor has at least one window, and preferably a plurality of windows in a matrix arrangement for making the area scale visible for the position measuring head.

In a preferred configuration comprising a plurality of regularly arranged observation windows for the area scale, these windows—or at least a part of them—are created by recesses between individual coil sets and/or triplets of in each case three flat coils forming a set with regard to phase. This enables a dense series arrangement of the n flat coil partial arrangements and thus, on the one hand, a high-grade utilization of the stator surface, and a sufficiently dense placement of observation windows, on the other.

In a further realization, the rotor comprises a chessboard-like arrangement of rows of magnets, in particular four square rows of magnets in a chessboard arrangement. In an advantageous geometric configuration, the rows of magnets cover substantially the central area of the rotor. Each row of magnets thereby forms a so-called Halbach array in an advantageous manner.

The positioning table furthermore proposed within the scope of the invention comprises, apart from a planar positioning apparatus of the kind mentioned above, holding and guiding means for the planar positioning apparatus, and an object holder for holding an object to be positioned. Such a positioning table may form a substantial part of a machining arrangement, in particular a tool machine, or else of a measurement arrangement, specifically for measuring complex work pieces, and thus enables their manufacturing in a simplified manner and at a reduced expenditure.

Advantages and expedient characteristics of the invention incidentally arise from the following sketch-like description of exemplary embodiments by means of the Figures. Shown are in:

FIGS. 1 and 2 a schematic sectional view and a top view of a known planar positioning apparatus, respectively, and FIG. 3 a schematic representation (cut-out representation in the manner of a top view) of a coil arrangement according to an embodiment of the invention, and FIG. 3A a detailed view therefrom.

FIG. 3, in which reference numerals have been assigned following the designation of certain parts of the planar positioning apparatus from FIGS. 1 and 2, shows a part of the coil arrangement 101 on a stator plate 109, which comprises groups of elongate coil partial arrangements (not referred to separately in FIG. 3) extending mutually perpendicular. All of the flat coils extending in the one direction (in FIGS. 3 and 3A in the vertical direction) are realized substantially by conductors tracks on a first plane of a dual-plane printed circuit board, and all of the flat coils extending in the other direction (in FIGS. 3 and 3A in the horizontal direction) are realized over the majority of their extent as conductor tracks on the second plane of that dual-plane printed circuit board. The former conductor tracks are illustrated as solid lines, whereas the conductor tracks on the second plane are illustrated as dashed lines. In the cut-out representation of FIG. 3A, a coil partial arrangement (a coil set) of the first type is designated by numeral 101a, whereas a coil partial arrangement of the second type, which has a winding extent that is oriented perpendicular to the first type, is designated by numeral 101b.

It is obvious that each coil partial arrangement comprises 3 coils which are interleaved with one another and respectively have a largely rectangular conductor extent.

Over the majority of the extension of the flat coils, the conductors thereof may be realized in an unproblematic way by a parallel arrangement of the conductor tracks patterned into the respective conductor plane of the printed circuit board. In crossover regions Xa, Xb and connection regions Ya, Yb, however, a part of the connection ends of the individual flat coils of each coil set are required to leave the corresponding main extension plane so that short-circuits will not occur between conductor tracks. This is identified in the Figures by the accordingly changed representation of the path of the lines for representing the conductor tracks.

The connection regions Ya, Yb of the respective coil partial arrangements 101a and 101b, respectively, occupy, in the realization shown here, a surface of less than 5%, specifically a surface of about 2.5%, of the surface of the extension of the respective coil partial arrangement, and thus have to be qualified as small connection areas. Their shape may be considered approximately as being rectangular in the top view.

Technologically, the "leap" into the respective opposite plane (consequently from the first into the second or the second into the first plane) can be realized by traditional through-connections (vias), accordingly through break-throughs in the insulating carrier material which are filled with conductive material. It should be emphasized that the inventive interleaving of the flat coils of one coil set is geometrically configured such that all of the crossover regions can be realized in a single additional conductor plane, and therefore—in contrast to a traditional interleaving of three associated flat coils—a third conductor or winding plane is not required.

The realization of the invention is not restricted to this example but likewise possible in a variety of modifications which are in the scope of skilled action.

The invention claimed is:

1. Planar positioning apparatus, comprising
   a stator which comprises a coil arrangement of flat coils,
   a rotor which is arranged opposite the stator in the operating position of the positioning apparatus and has a planar magnet arrangement comprising a plurality of rows of magnets, wherein the plane which is spanned by the planar magnet arrangement is arranged parallel to the plane of the coil arrangement,
   a position detecting device for detecting the position of the rotor relative to the stator, and
   an evaluation and control device for evaluating position signals of the position detecting device and for controlling a current supply to the coil arrangement for controlling the position of the rotor with respect to the stator,
   wherein the coil arrangement comprises in each case n×3 (n≥1) elongate flat coils which are interleaved with one another, in a first and second orientation of the coil arrangement, which over the majority of their extent, are designed as conductors tracks of a first plane of a multiple-plane printed circuit board, and the conductor tracks of the three associated flat coils enclose crossover regions which run in a second plane of the multiple-plane printed circuit board, while all of the connection ends of the three associated flat coils each are concentrated in a small connection region of the multiple-plane printed circuit board.

2. Planar positioning apparatus according to claim 1, wherein the n×3 flat coils of the first orientation run over the majority of their extent in the first plane and the associated crossover regions in the second plane of the multiple-plane printed circuit board, while the n×3 flat coils of the second orientation run over the majority of their extent in the second plane and the associated crossover regions in the first plane of the multiple-plane printed circuit board.

3. Planar positioning apparatus according to claim 1, wherein in each case a part of the connection ends of all of the flat coils is in the first plane of the multiple-plane printed circuit board, and another part in the second plane thereof.

4. Planar positioning apparatus according to claim 1, wherein all of the flat coils are realized to have substantially the same length and the same ohmic resistance.

5. Planar positioning apparatus according to claim 1, wherein all of the flat coils are realized to have a largely rectangular conductor extent.

6. Planar positioning apparatus according to claim 1, wherein the small connection area of the multiple-plane printed circuit board occupies a surface of less than 10%, in particular of less than 5% of the surface occupied by the flat coils and is in particular formed to be rectangular.

7. Planar positioning apparatus according to claim 1, wherein the multiple-plane printed circuit board is a dual-plane printed circuit board.

8. Planar positioning apparatus according to claim 1, wherein the coil arrangement covers substantially the entire surface of the stator.

9. Planar positioning apparatus according to claim 1, wherein the position detecting device comprises at least one position measuring head arranged within the stator or the rotor in the operating position of the positioning device, and an area scale fixed true to position to the rotor or the stator, and wherein the stator or the rotor has at least one window, and preferably a plurality of windows in a matrix arrangement for making the area scale visible for the position measuring head.

10. Planar positioning apparatus according to claim 9, wherein at least a part of the plurality of windows in the matrix arrangement is either disposed between adjacent flat coils of in each case three associated flat coils or between the in each case n adjacent groups each comprising three associated flat coils.

11. Planar positioning apparatus according to claim 1, wherein the rotor comprises a chessboard-like arrangement of rows of magnets, each of which in particular forming a Halbach array, in particular four square rows of magnets in a chessboard arrangement.

12. Planar positioning apparatus according to claim 11, wherein the rows of magnets cover substantially the central area of the rotor.

13. Positioning table comprising a planar positioning apparatus according to claim 1, wherein the positioning table has holding and guiding means for the planar positioning apparatus and an object holder for holding an object to be positioned.

14. Machining arrangement, in particular machine tool, comprising a positioning table according to claim 13.

15. Measuring arrangement comprising a positioning table according to claim 13.

* * * * *